United States Patent
Wang

(10) Patent No.: US 10,147,492 B1
(45) Date of Patent: Dec. 4, 2018

(54) MOSFET THRESHOLD VOLTAGE SENSING SCHEME FOR NON-VOLATILE MEMORY

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

(*) Notice: Subject to any disclaimer, the term of this patent is extended or adjusted under 35 U.S.C. 154(b) by 0 days.

(21) Appl. No.: 15/822,804

(22) Filed: Nov. 27, 2017

(51) Int. Cl.
G11C 7/00 (2006.01)
G11C 16/26 (2006.01)
G11C 7/12 (2006.01)
G11C 7/06 (2006.01)
G11C 7/08 (2006.01)

(52) U.S. Cl.
CPC .............. *G11C 16/26* (2013.01); *G11C 7/067* (2013.01); *G11C 7/08* (2013.01); *G11C 7/12* (2013.01)

(58) Field of Classification Search
CPC .......... G11C 16/26; G11C 7/067; G11C 7/08; G11C 7/12
USPC ........................................... 365/203
See application file for complete search history.

(56) References Cited

U.S. PATENT DOCUMENTS

| | | | |
|---|---|---|---|
| 6,449,204 B1 * | 9/2002 | Arimoto | G11C 7/1045 365/189.09 |
| 7,995,398 B2 | 8/2011 | Wang | |
| 9,048,137 B2 | 6/2015 | Wang | |
| 9,685,239 B1 | 6/2017 | Wang | |

* cited by examiner

Primary Examiner — Huan Hoang
(74) Attorney, Agent, or Firm — Muncy, Geissler, Olds & Lowe, PC

(57) ABSTRACT

A non-differential sense amplifier circuit for reading out information in Non-Volatile Memories (NVMs) is disclosed. The circuit comprises a half latch, a PMOSFET device, a switch device and a reset transistor. The PMOSFET device has a source electrode connected to a digital voltage rail, a drain electrode connected to an output node of the half latch and a gate electrode connected to a bitline path coupled with a selected NVM cell. After the bitline path is pre-charged and the reset transistor is turned off, applying a read voltage to a word line related to the selected NVM cell causes a voltage at the gate electrode of the PMOSFET device to drop differently according to an electrical conductance state of the selected NVM cell. The disclosed circuitries can achieve extra low power consumption and high sensing speed compared to those in the conventional sensing scheme.

15 Claims, 8 Drawing Sheets

MOSFET THRESHOLD VOLTAGE SENSING SCHEME FOR NON-VOLATILE MEMORY

BACKGROUND OF THE INVENTION

Field of the Invention

The invention relates to integrated circuitries for reading out the stored information in non-volatile memories. In particular, the threshold voltage of a Metal Oxide Semiconductor Field Effect Transistor (MOSFET) device in sense amplifier circuitries is applied as a reference voltage for determining the stored information in the Non-Volatile Memory (NVM).

Description of the Related Art

In an integrated memory circuit, a readout circuitry is applied to detect and determine the data content of an NVM cell. Usually, an NVM cell stores its data content by mean of altering its electrical conductance characteristics. "Non-Volatile Memories" keep their electric conductance characteristics even after the power for the memory devices is off. For instances, Electrical Erasable Programmable Read Only Memory (EEPROM) devices alter the threshold voltages of Metal-Oxide-Semiconductor Field Effect Transistor (MOSFET) by storing charges in between the control gate and the transistor channel; Read Only Memories (ROMs) apply MOSFETs' connection or disconnection to a bitline for representing a storing "bit"; Phase Change Memories (PCM) apply the properties of amorphous/polycrystalline phase variations for their high/low electrical conductance characteristics represented by "bit(s)"; Magneto-resistive Random Access Memories (MRAM) apply the magnetic polarized electron currents to pass through the composited magnetic films for their high/low electrical conductance characteristics represented by the storing "a bit"; Resistive Random Access Memories (ReRAM) apply the oxygen composition variations or the conducting filament formations in the ReRAM material matrixes for their high/low electrical conductance characteristics represented by "a bit". Basically, the principle of storing information in NVM cells is to alter memory cells' electrical conductance states and the electric conductance states remain non-volatile after power is turned off. The non-volatile conductance states of NVM devices are represented by bit(s).

To read out the binary data contents of the selected NVM devices, electrical biases are applied to the NVM devices to detect and determine the electrical conductance "state" by measuring their responding currents. In the conventional readout scheme, the responding current is pre-amplified and compared with a referencing current. Then the currents are compared by a current-voltage differential amplifier comparator 110 to determine the NVM states as shown in FIG. 1 (prior art). The output 150 of the comparator 110 indicates two classes of NVM electrical conductance. One class is the high NVM electrical conductance for the large responding current and the other class is the low NVM electrical conductance for the low responding current, respectively. In this readout process, the large steady DC currents are mainly generated from the memory cells 140, a current amplifier 120, the differential amplifier comparator 110, and a referencing current generating circuit 130. Those large steady currents lead to high power consumption for reading out the information in NVM cells.

To eliminate the large steady DC current in the NVM readout process for both the time of sensing and standby, we have disclosed the readout circuitries and their operating methods in U.S. Pat. No. 7,995,398. In the readout circuitry shown in FIG. 2, the voltage at the node 201 of a half latch connected to a selected NVM device 202 through a conducting bitline path (a bitline and selection transistors) decreases rapidly from an initial pre-charged voltage by the discharging process of a "high conductance" NVM device to the ground potential. While the voltage at the node 201 remains close to the initial pre-charged voltage without discharging for a "low conductance" NVM device. The decreasing voltage at the node 201 for the "high conductance" NVM device has reached a voltage level such that the half latch begins to flip. The read voltage signals, $V_R$ and ground, at the two output nodes of the half latch are converted by the level-shifter latch into the digital signals, $V_{CC}$ ($V_{DD}$) and ground ($V_{SS}$), at the complementary nodes D and D. In the circuitry, the bitline voltage for the capability of the half latch to flip depends on the threshold voltages and current strengths of the P/N MOSFET devices, the applied half latch rail voltage $V_R$, and the driving current strengths of the "high conductance" NVM devices 202. Because of the positive feedback inherited in latches, the driving current strengths of the "high conductance" NVM devices are always competing with the sense circuit device currents to flip. For the example of a failure flipping case, the NVM driving current is too small to compete with the PMOSFET ($MP_2$) current, resulting in the voltage potential at the node 201 clamped to a voltage above the latch flipping voltage point. In such a failure scenario, the sensing circuitry is flown with large currents through the series-connected P/N MOSFET paths in the latches, and consumes large power.

In practice, the driving currents of NVM devices tend to decrease as the technology scaling down the NVM devices for higher memory density and lower fabrication cost. For example, the driving currents of the semiconductor NVM devices for NOR flash could drop from tens of micro-amperes to hundreds of nano-amperes for the smaller device width below 90 nanometer. The sensed currents for the NAND flash could drop from few micro-amperes to tens of nano-amperes for connecting more numbers of NVM devices in an NAND series string. In order to expand the applicability of the sensing scheme not limited by the NVM diminishing current driving capabilities, we connect the voltage sensing path of a NVM device directly to the gate of a MOSFET device in the sensing circuitry. In one aspect of this invention, the gate-connection totally eliminates the device current competition between the NVM device and the MOSFET devices in the latch circuitry as shown in the previous disclosure. Furthermore, as the typical switching characteristics, a MOSFET device has usually several order magnitudes of current responses for a few tens of milivolts of applied gate voltages in the sub-threshold region. Applying the threshold voltage of MOSFET could be the most decisive way to determine the conductance states of NVM devices. In this invention, the sensitivity of detecting the discharging bitline voltage potentials is greatly amplified by connecting the discharging bitline path directly to the gate of a MOSFET device for a large responding current.

Another aspect of this invention is that since the threshold voltage of a MOSFET device is provided by the fabrication process, the present sense amplifier circuit is immune from the chip external voltage supply variations.

Another aspect of this invention is that the present sense amplifier circuit does not require a referencing current or voltage. The circuit design complexity for generating the referencing current is also omitted.

Another aspect of this invention is that the present sense amplifier circuit is non-differential type. The offset caused by the device mismatch in the sense amplifier circuit becomes irrelevant.

SUMMARY OF THE INVENTION

FIG. 3 shows the schematics for the NVM sense amplifier circuit according to the invention. The NVM sense amplifier circuit 300 consists of a threshold voltage sensing circuit 310 ($MP_1$ and $MN_1$), a half latch 320, a voltage level shifter latch 330, and a ground reset device ($MN_2$). In the threshold voltage sensing circuit 310, the gate electrode 301 of the PMOSFET $MP_1$ attached with a gate-charging device MN1 is connected to a bitline attached with a selected NVM device 340 through a bitline selection MOSFET device unit 360. The source and drain electrodes of $MP_1$ are connected to the node 304 biased with the read voltage $V_{DR}$ and to the node 302 in the half latch 320, respectively. The half latch 320 consists of a PMOSFET device $MP_2$ and an inverter of $MP_3$ and $MN_3$. The gates of $MP_2$ and $MP_3$ are cross-connected to the nodes 302 and 303 for forming the latch 320. The high voltage supply node of the half latch 320 is connected to the node 304 with voltage bias $V_{DR}$. The gate of the reset device $MN_2$ receives the digital signals from the node $\overline{\text{SensingEnable}}$ with its source and drain tied to the ground and the node 302, respectively. The inputs nodes 305 and 306 (the gates of $MN_4$ and $MN_5$) of the voltage level-shifter latch 330 are connected to the output nodes 303 and 302 of the half latch 320, respectively. The gates of the two PMOSFET devices $MP_4$ and $MP_5$ are cross-connected to the output nodes 307 and 308 for forming the voltage level-shifter latch 330.

In the read out mode, the time sequence of operations is shown in FIG. 4. The pre-charging circuit 350 is activated for a period of charging time $T_{chg}$ (the first row of FIG. 4) to charge the conducting bitline path (a selected bitline attached with a selected NVM device) to a voltage close to $V_{DR}$. When the nodes "Sensing Enable" (not shown) and $\overline{\text{SensingEnable}}$ (the second row in FIG. 4) are activated for the digital high/low voltage signals $V_{DD}$ and $V_{SS}$, the gate-charging device $MN_1$ and the reset device $MN_2$ are turned off by the node $\overline{\text{SensingEnable}}$. The conducting bitline path is then connected to the gate of $MP_1$ device by one of the bitline selection MOSFET devices in the unit 360. After turning off the pre-charging circuit 350, the selected word-line is applied with a wordline read voltage $V_{WR}$ (the third row of FIG. 4) to the gates of the selected NVM devices (a selected wordline) to discharge the connecting bitline paths to the ground voltage potential through the selected NVM devices 340. During the discharging process, the voltage potentials at the gate 301 of $MP_1$ for the selected NVM devices with "high conductance" decrease much faster than those for the selected NVM devices with "low conductance" as illustrated in the fourth row of FIG. 4. For the selected NVM devices with "high conductance", the voltage potentials at the gates 301 of $MP_1$ are the first to reach the $MP_1$ "on" voltage of ($V_{DR}-V_{thp}$) (the fourth row of FIG. 4), where $V_{thp}$ is the threshold voltage of $MP_1$. The $MP_1$ "on" current is then strong enough to flip the half latch 320, resulting in the flipping of the level-shifter latch 330. The digital output data Q of the NVM sense amplifier circuit 300 are then flipped to digital "1" (the fifth row of FIG. 4). Since the voltage potentials at the gates 301 of $MP_1$ hardly reach the $MP_1$ "on" voltage during the period of sensing time (the fourth row of FIG. 4) for the selected NVM devices with "low conductance", the digital output data Q of the NVM sense amplifier circuit 300 remain at its default digital value "0".

While in the standby mode, the sense amplifier circuit 300 is not connected to any bitline and the node "$\overline{\text{SensingEnable}}$" is at the "low" voltage $V_{SS}$ state. The voltage signal $V_{DD}$ for $\overline{\text{SensingEnable}}$ is applied to the gates of $MN_1$ and $MN_2$ to pass the read voltage signal $V_{DR}$ to turn off $MP_1$ and the ground voltage to reset the half latch 320 for the level-shifter latch 330 recovers the output Q to the default state "0". Since the whole sense amplifier circuit 300 is in a stable "default" latched state "0" for the standby mode, there are no flowing current paths for the high voltage biases ($V_{DR}$ and $V_{DD}$) to the ground voltage.

FIG. 5 shows a schematic diagram of a sense amplifier circuit for the low power NVM applications according to the invention. As for the low power NVM applications operated at a low voltage supply ($V_{DD}$~1V), the read voltage $V_{DR}$ is usually designed to be close to the digital "high" voltage signal $V_{DD}$. Referring to FIG. 5, the NVM sense amplifier circuit 500 consists of a threshold voltage sensing circuit 510 ($MP_1$ and $MP_{chg}$), a half latch 520 and a ground reset device ($MN_2$). Comparing FIGS. 3 and 5, since the output of the half latch 520 is able to drive the digital voltage signals ($V_{DD}$ and $V_{SS}$) in FIG. 5, the level shifter latch 330 in FIG. 3 can be then omitted as shown in FIG. 5. Meanwhile, in order to pass the $V_{DD}$ signal to fully shut off $MP_1$ in the standby mode, the device $MN_1$ in FIG. 3 can be replaced by a PMOSFET device $MP_h$ in the threshold voltage sensing circuit 510 with the "Sensing Enable" voltage signal connected to the $MP_{chg}$'s gate.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

The present invention includes methods and schematics to achieve the low-power reading out purpose for NVM cells. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1:
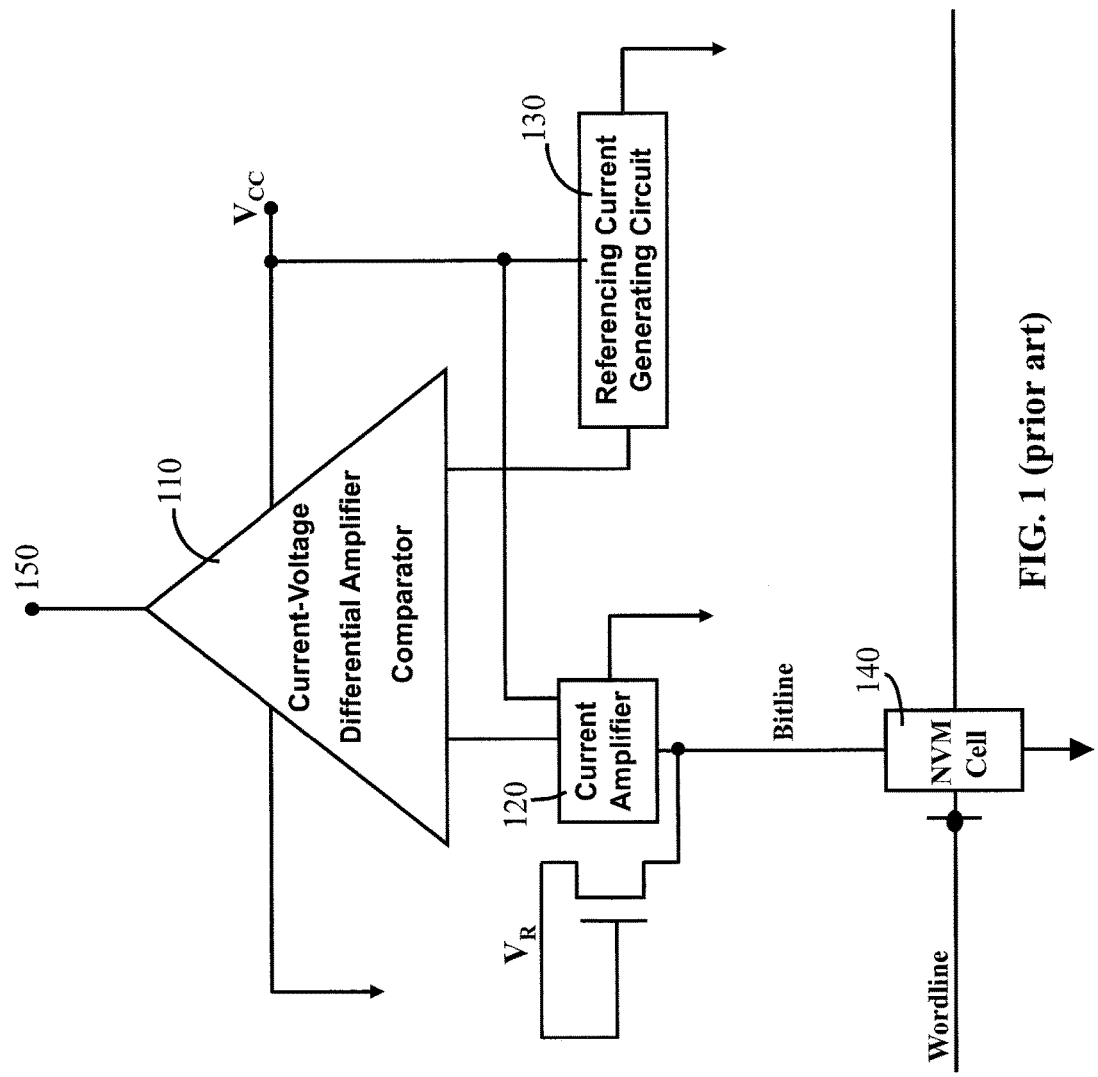
FIG. 1 shows the prior art of a typical NVM cell readout circuit. Note that the steady current is generated from the current paths of a high conductance bitline, a current amplifier, a differential amplifier comparator, and a referencing current generating circuit.
Figure 2:
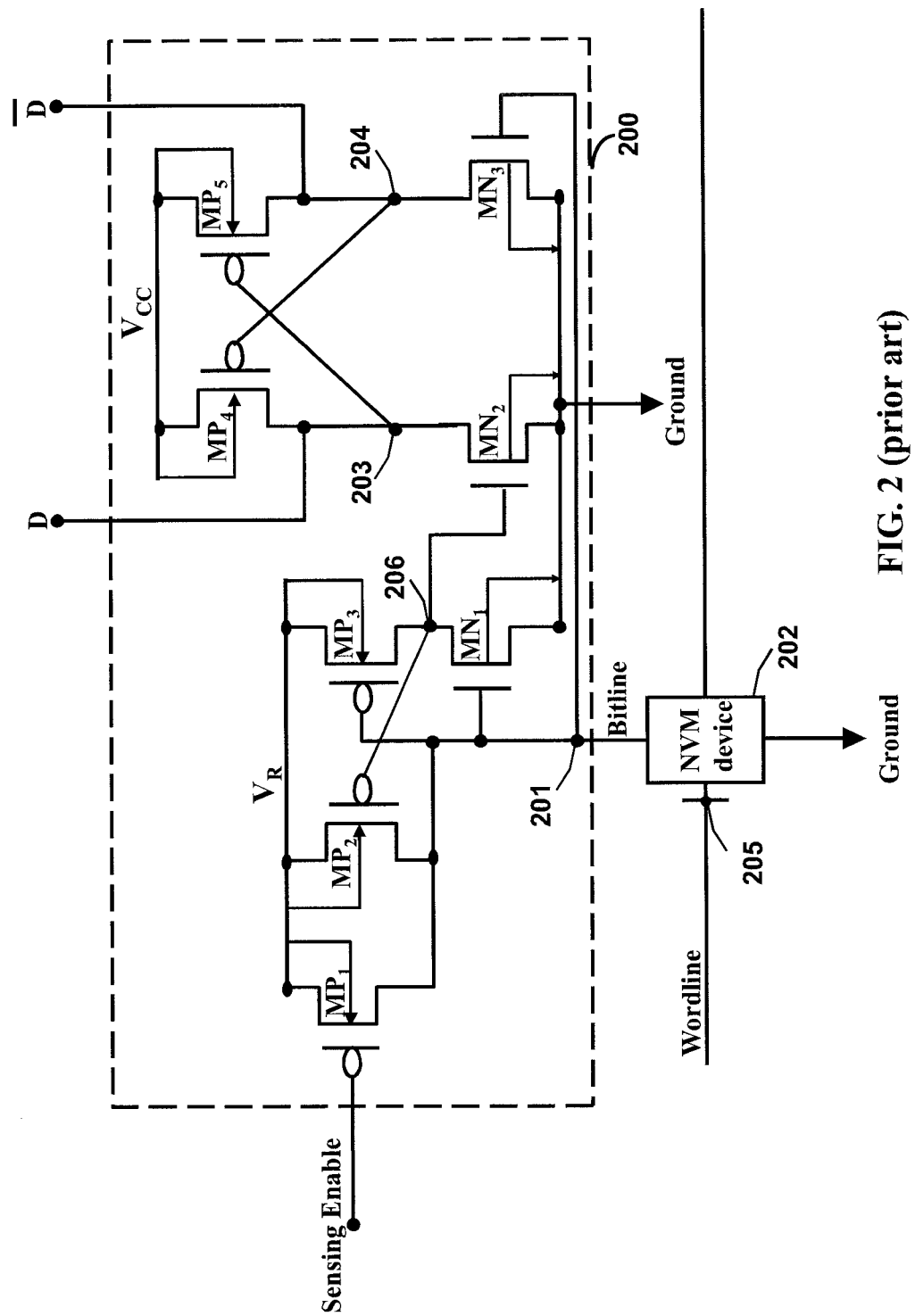
FIG. 2 shows the readout circuit schematics according to the prior art.
Figure 3:
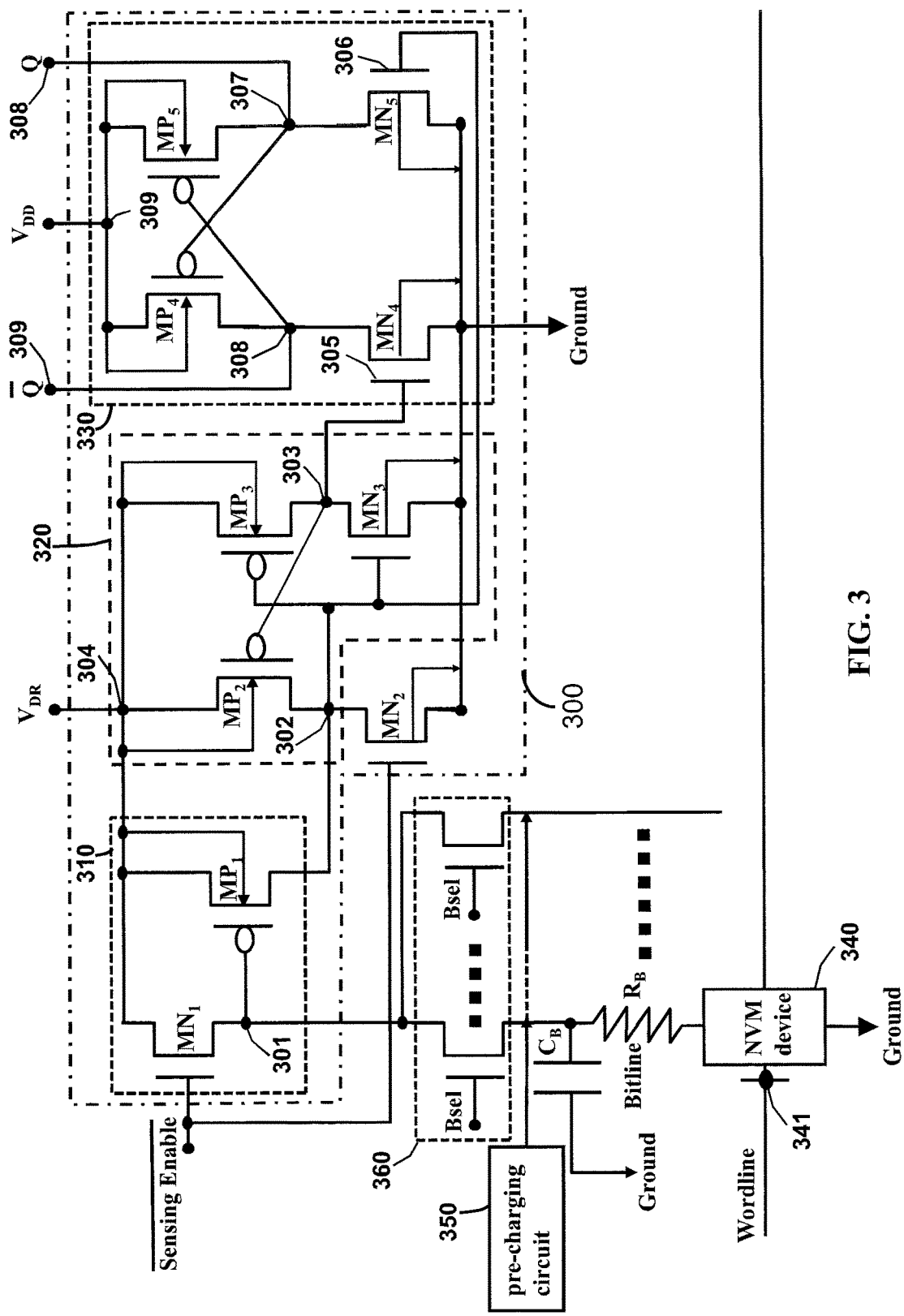
FIG. 3 shows the schematics for the NVM sense amplifier circuit according to the present invention.
Figure 4:
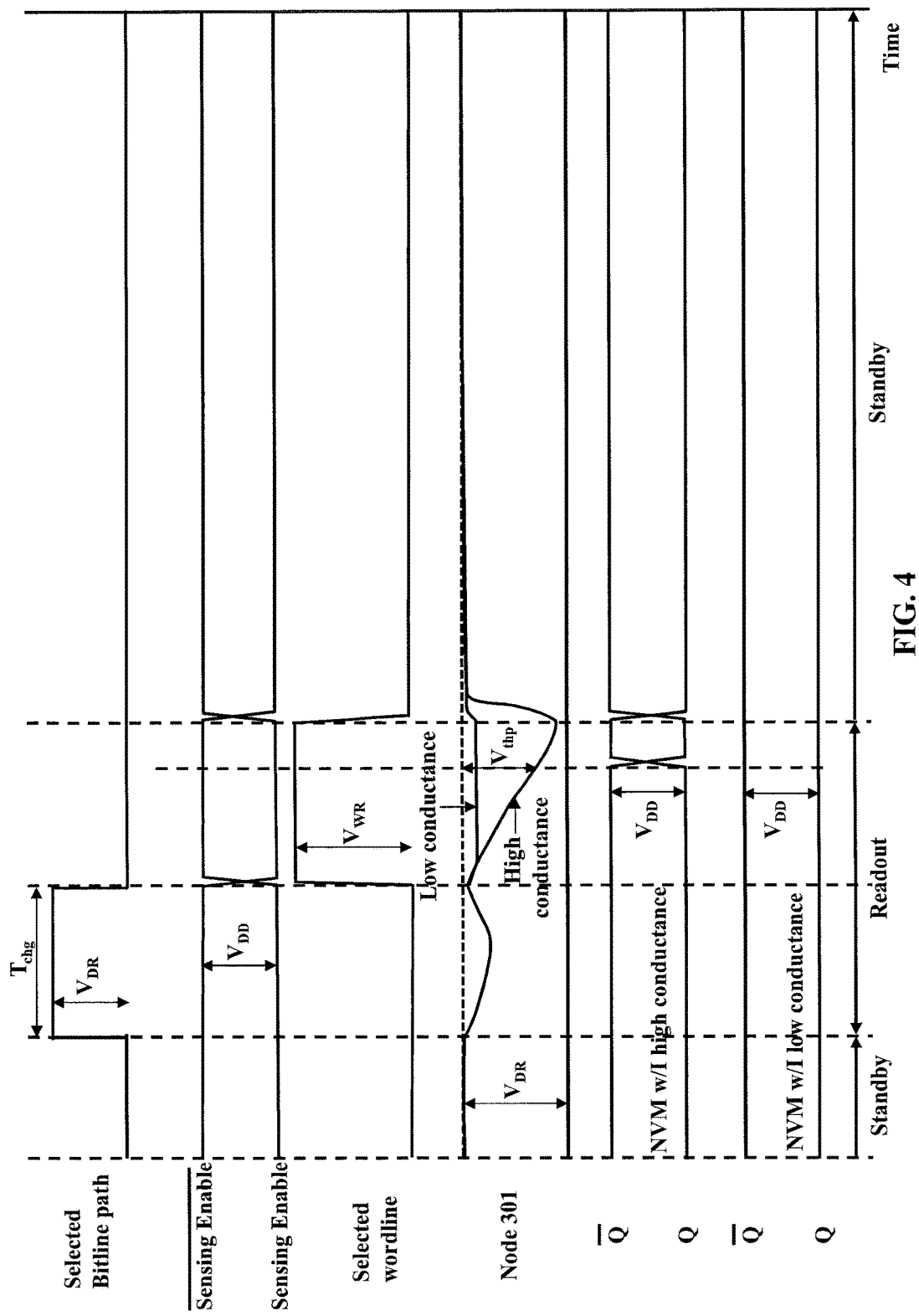
FIG. 4 shows a time diagram of sensing operations including a read out mode and a standby mode for the NVM sense amplifier circuit in FIG. 3 according to the present invention.
Figure 5:
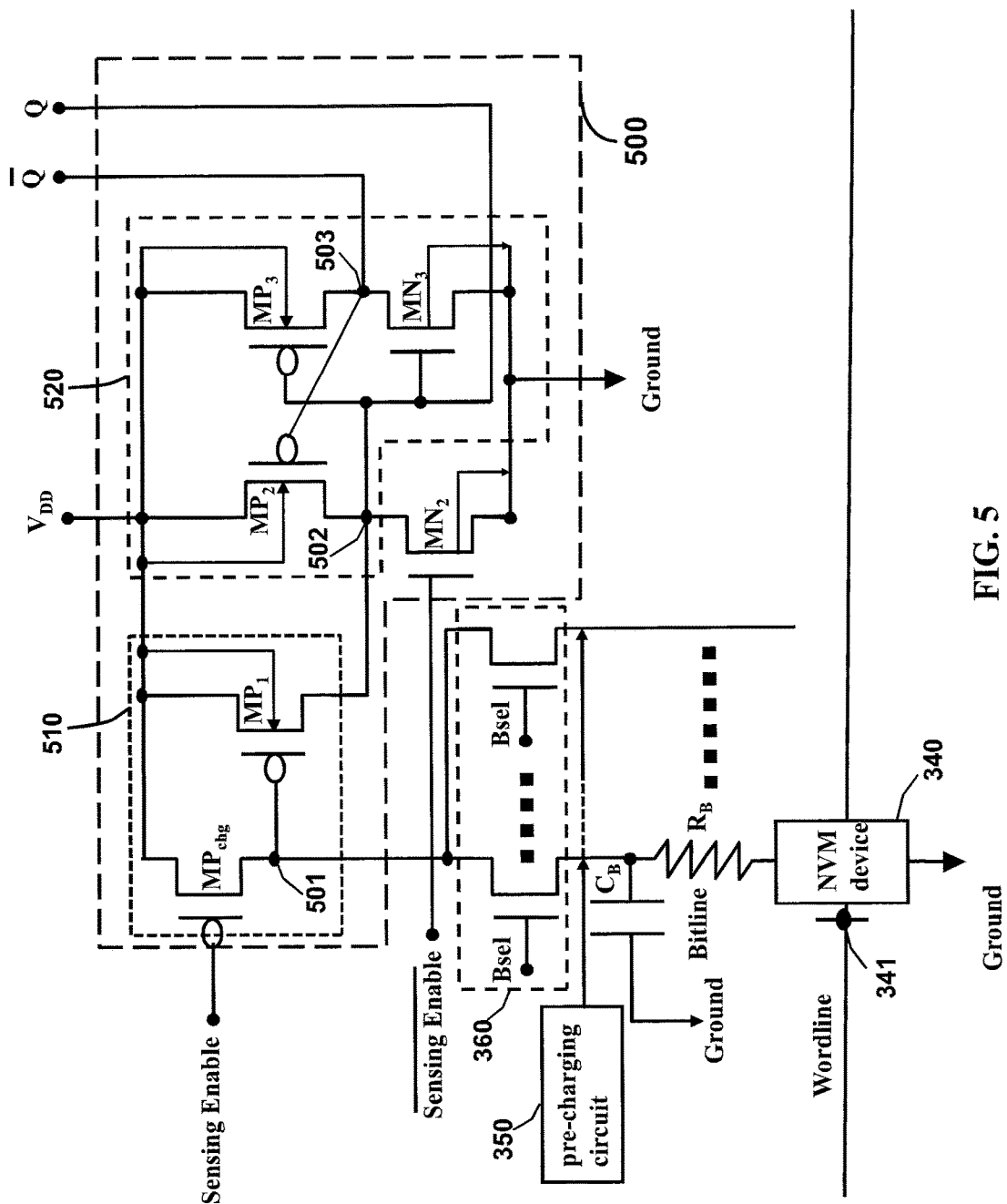
FIG. 5 shows a schematic diagram of a sense amplifier circuit for low power NVM applications, where the read voltage $V_{DR}$ is about the digital voltage $V_{DD}$.
Figure 6:
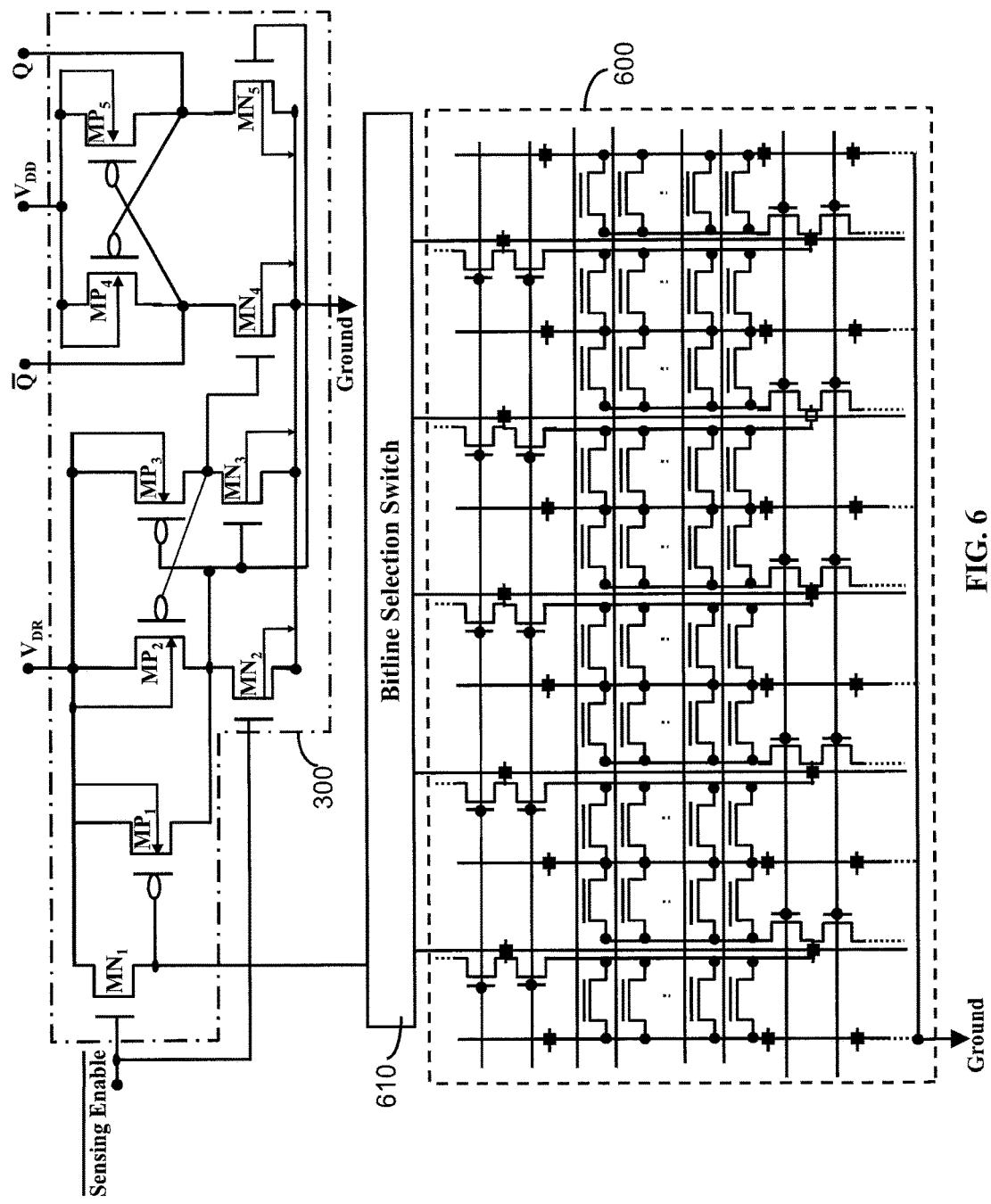
FIG. 6 is a schematic diagram showing the sense amplifier circuit 300 applied to the Field Sub-bitline NOR (FSNOR) flash array according to an embodiment of the present invention.
Figure 7:
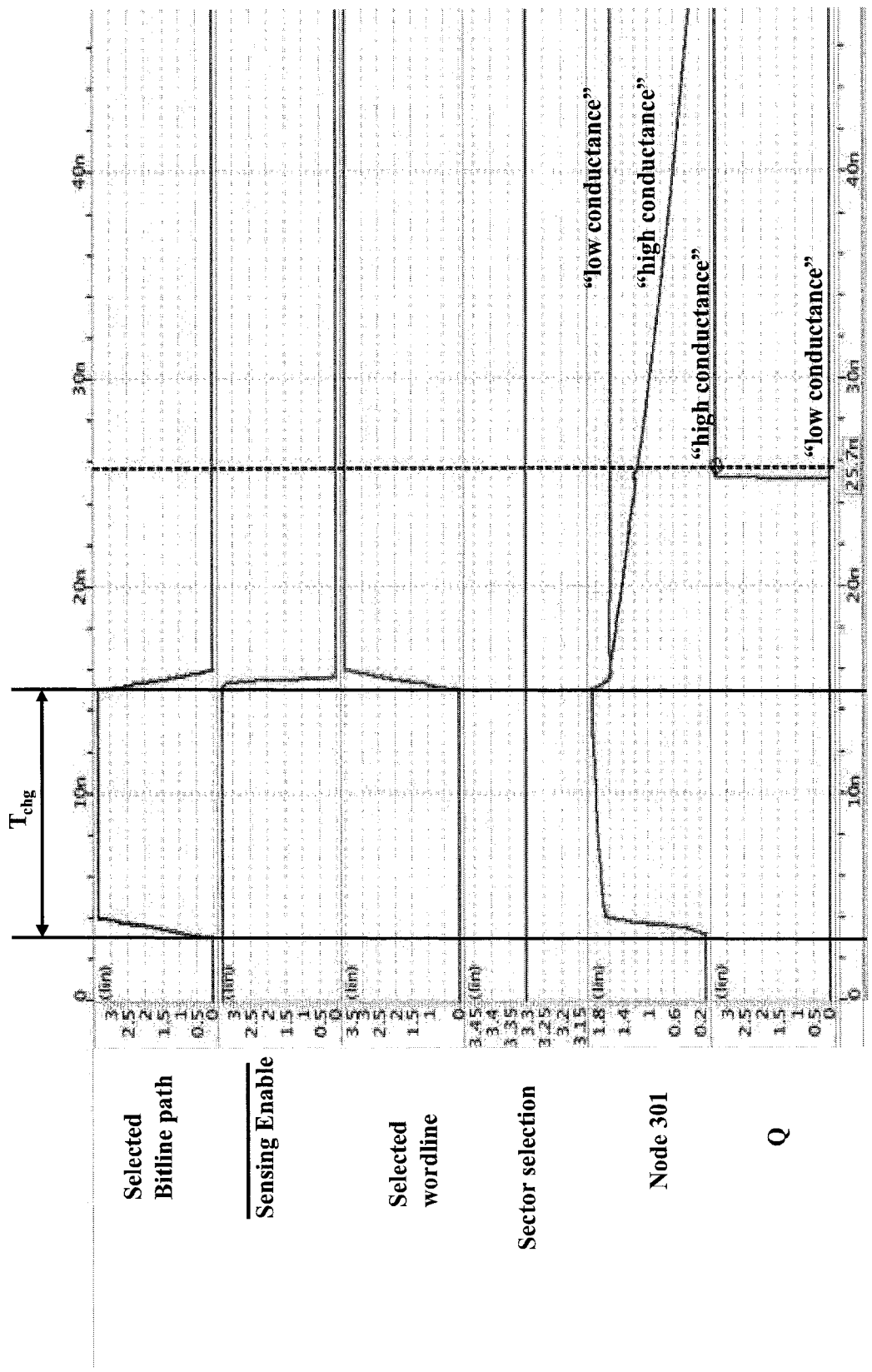
FIG. 7 shows a simulation result of the sense amplifier circuit applied to FSNOR flash array in FIG. 6.

FIG. 6 is a schematic diagram showing that the sense amplifier circuit 300 of the invention is applied to a FSNOR flash array (disclosed in U.S. Pat. No. 9,685,239B1, which is incorporated herein by reference in its entirety). In the FSNOR flash array 600, the capacitance and resistance of the main bitline are ~400 fF and ~3 kΩ respectively according to the RC-extraction of the real cell array layout for a 45 nm process technology node. Referring to FIG. 6, the threshold voltage of the PMOSFET devices for $MP_1$ is about 0.7 V provided by the process technology node; the supply voltages $V_{DD}$ of the flash chip are designed to operate between 2.7 V to 3.6 V; the read voltage $V_{DR}$ is designed in the range of 1.2V to 2V. As shown in FIG. 7, the selected bitline path is pre-charged for ~10 ns (first row in FIG. 7) such that the voltage potential at the gates 301 of $MP_1$ reaches about 1.8 V (the fifth row). When the pre-charging circuit 350 is turned off and the selected wordline is applied with a wordline read voltage $V_{WR}$ (the third row), the voltage potentials at the gates 301 of $MP_1$ begin to drop. The voltage potentials at the gates 301 of $MP_1$ for the "high conductance" NVM devices with the erased low threshold voltage below 2.5V for an applied gate voltage of 3.5V rapidly drop to the voltage of ~1.1 V (=$(V_{DR}-V_{thp})$=1.8 V–0.7 V) to turn on $MP_1$ within tens of nano-seconds. While the voltage potentials at the gates 301 of $MP_1$ for the low conductance NVM devices with the programmed high threshold voltage above 4.5 V for an applied gate voltage of 3.5 V remain at ~1.6 V during the period of sensing time. Note that the initial voltage potential drop of 0.2 V (the fifth row in FIG. 7) for both "high and low" conductance NVM devices is caused by the charge sharing of the bitline paths for turning on a bitline selection transistor (not shown) in a bitline selection switch 610. As we can see from the last row of FIG. 7, the outputs Q of the sense amplifier circuit 300 for the "high conductance" NVM devices flip to the digital "high" signals "$V_{DD}$", while the outputs Q of the sense amplifier circuit 300 for the "low conductance" NVM devices remain at the default value of the "low" digital signal, $V_{SS}$. The whole sequence to read out the non-volatile memory data content is less than 30 nano-seconds for the slowest simulation corner. Meanwhile the active peak currents (~tens of μA) in the sense amplifier circuit 300 only occur during the flipping time period of few nano-seconds. In the standby mode, the sense amplifier circuit 300 only consumes around tens of nano-amps.

Figure 8:
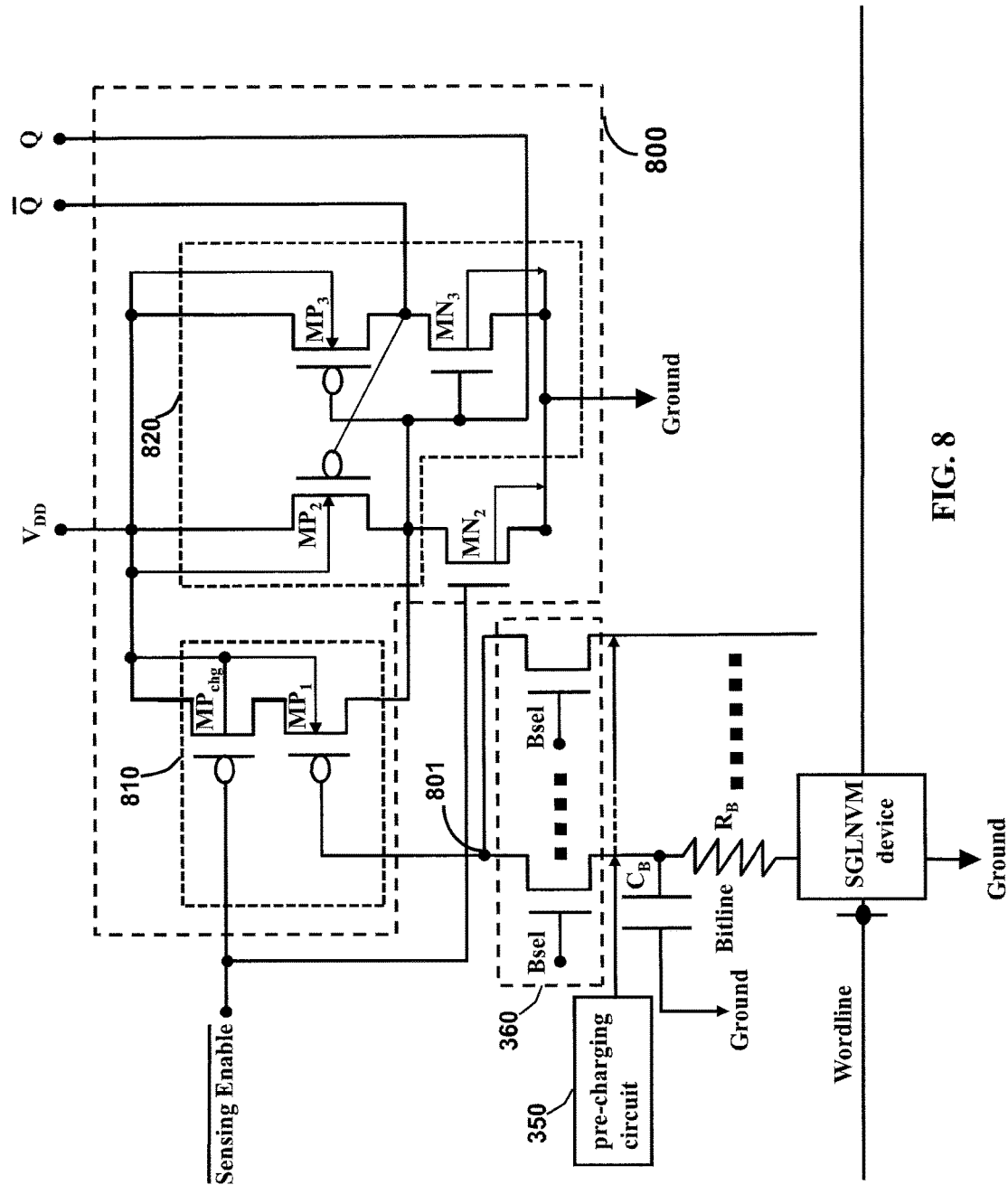
FIG. 8 is a schematic diagram showing a sense amplifier circuit 800 applied to Scalable Gate Logic NVM (SGL-NVM) flash array according to another embodiment of the present invention.

FIG. 8 is a schematic diagram showing that a sense amplifier circuit 800 of the invention is applied to the 1.2 V low-power SGLNVM flash fabricated with the standard CMOS logic process technology (disclosed in U.S. Pat. No. 9,048,137B2, which is incorporated herein by reference in its entirety). Note that the sense amplifier circuit 800 can be also applicable to any type of low-power NVM devices without being limited to the low power SGLNVM flash. Since we have applied 1.2 V for the pre-charged voltage and the read voltage (i.e., read voltage $V_{DR}$ is about the digital voltage $V_{DD}$), the level-shifter latch has been omitted in the sense amplifier circuit 800. While in standby mode, the $MP_{chg}$ series-connected between the 1.2 V voltage supply $V_{DD}$ and $MP_1$ is "off" to break down the possible direct current path in the circuit 800. The voltage potential at the gate 801 of $MP_1$ to flip is about 0.6 V, which is consistent with the voltage of ~$(V_{DD}-V_{thp})$=1.2 V $(V_{DD})$–0.6 V (the threshold voltage with N-type well biased)=0.6 V. The whole sequence to read out the non-volatile memory data content is measured to be about 25 nano-seconds.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of non-volatile memory elements including the types of non-volatile memory devices such as the conventional MOSFET devices with floating gate, charge trap dielectrics, or nano-crystals for charge storage material, and the non-volatile memory devices having the "high conductance" and "low conducting" states such as EEPROM, ROM, other types of flash, Phase Change Memory (PCM), Magneto-Resistive Random Memories (MRAM), Resistive Random Access Memory (RRAM) will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A sense amplifier circuit for sensing a stored bit from a selected Non-Volatile Memory (NVM) cell in a semiconductor NVM device, comprising:
    a half latch coupled between a digital voltage rail having a first digital voltage and a ground voltage node and having a first output node and a second output node;
    a PMOSFET device having a source electrode connected to the digital voltage rail, a drain electrode connected to the first output node and a gate electrode connected to a bitline path coupled with the selected NVM cell;
    a switch device connected to the digital voltage rail for selectively activating the PMOSFET device in response to a first control signal; and
    a reset transistor connected between the first output node and the ground voltage node for selectively resetting the first output node to a ground voltage in response to a second control signal.

2. The sense amplifier circuit according to claim 1, wherein the stored bit is related to an electrical conductance state of the selected NVM cell.

3. The sense amplifier circuit according to claim 1, wherein after the bitline path is pre-charged to the first digital voltage and the reset transistor is turned off, the PMOSFET device is activated to sense a voltage level at its gate electrode by the switch device in response to the first control signal.

4. The sense amplifier circuit according to claim 3, wherein after a read voltage is applied to a word line associated with the selected NVM cell, the voltage level at the gate electrode of the PMOSFET device drops differently according to an electrical conductance state of the selected NVM cell.

5. The sense amplifier circuit according to claim 4, wherein the voltage level at the gate electrode of the PMOSFET device is pulled low enough to turn on the PMOSFET device if the selected NVM cell is turned on, otherwise the voltage level at the gate electrode of the PMOSFET device is not able to turn on the PMOSFET device.

6. The sense amplifier circuit according to claim 1, wherein one of the first and the second output nodes outputs the stored bit.

7. The sense amplifier circuit according to claim 1, wherein the half latch comprises:
   a PMOS transistor connected between the digital voltage rail and the first output node, a gate of the PMOS transistor being connected to the second output node; and
   an inverter connected between the digital voltage rail and the ground voltage node, an input of the inverter being connected to the first output node and the output of the inverter forming the second output node.

8. The sense amplifier circuit according to claim 1, further comprising:
   a level shifter for converting a first pair of complementary signals with the first digital voltage level from the first and the second output nodes into a second pair of complementary signals with a second digital voltage level.

9. The sense amplifier circuit according to claim 8, wherein the first digital voltage level is different from the second digital voltage level, and one of the second pair of complementary signals corresponds to the stored bit.

10. A method of sensing a stored bit from a selected non-volatile memory (NVM) cell in a semiconductor NVM device comprising a sense amplifier circuit, the sense amplifier circuit comprising a PMOSFET device and a half latch having a first output node and a second output node, the half latch being coupled between a digital voltage rail having a first digital voltage and a ground voltage node, a drain electrode and a source electrode of the PMOSFET device being respectively connected to the first output node and the digital voltage rail, the method comprising:
   resetting the first output node to a ground voltage;
   pre-charging a bitline path to a first digital voltage, the bitline path being coupled to the selected NVM cell;
   stopping pre-charging and resetting;
   connecting a gate electrode of the PMOSFET device to the bitline path;
   applying a read voltage to a word line associated with the selected NVM cell; and
   causing a voltage at the gate electrode of the PMOSFET device to drop differently according to an electrical conductance state of the selected NVM cell.

11. The method according to claim 10, wherein the step of causing further comprises:
   causing the voltage at the gate electrode of the PMOSFET device to drop below a predetermined voltage to turn on the PMOSFET device if the selected NVM cell is turned on; and
   causing the voltage at the gate electrode of the PMOSFET device to drop above the predetermined voltage level so that the PMOSFET device remains off if the selected NVM cell is turned off.

12. The method according to claim 11, wherein the predetermined voltage is equal to $(V_{DR}-V_{thp})$, where $V_{DR}$ denotes the first digital voltage and $V_{thp}$ denotes a threshold voltage of the PMOSFET device.

13. The method according to claim 10, wherein one of the first and the second output nodes outputs the stored bit.

14. The method according to claim 10, further comprising:
   converting a first pair of complementary signals with the first digital voltage level from the first and the second output nodes into a second pair of complementary signals with a second digital voltage level.

15. The method according to claim 14, wherein the second digital voltage level is different from the first digital voltage level, and one of the second pair of complementary signals corresponds to the stored bit.

\* \* \* \* \*